US010079259B2

United States Patent
Yu et al.

(10) Patent No.: US 10,079,259 B2
(45) Date of Patent: Sep. 18, 2018

(54) IMAGE SENSOR AND METHOD FOR FABRICATING THE SAME

(71) Applicant: UNITED MICROELECTRONICS CORP., Hsinchu (TW)

(72) Inventors: Shih-Chung Yu, New Taipei (TW); Kai-Chieh Chuang, Kaohsiung (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 15/407,541

(22) Filed: Jan. 17, 2017

(65) Prior Publication Data

US 2017/0125462 A1     May 4, 2017

Related U.S. Application Data

(62) Division of application No. 14/886,467, filed on Oct. 19, 2015.

(30) Foreign Application Priority Data

Aug. 6, 2015 (CN) .......................... 2015 1 0477505

(51) Int. Cl.
H01L 27/146     (2006.01)

(52) U.S. Cl.
CPC ...... *H01L 27/1463* (2013.01); *H01L 27/1464* (2013.01); *H01L 27/14621* (2013.01); *H01L 27/14623* (2013.01); *H01L 27/14627* (2013.01); *H01L 27/14629* (2013.01); *H01L 27/14632* (2013.01); *H01L 27/14636* (2013.01); *H01L 27/14643* (2013.01); *H01L 27/14645* (2013.01);

(Continued)

(58) Field of Classification Search
None
See application file for complete search history.

(56) References Cited

U.S. PATENT DOCUMENTS 7,078,779 B2    7/2006  Wang et al.
7,193,289 B2 *  3/2007  Adkisson .......... H01L 21/76819
                                                       257/292

(Continued)

OTHER PUBLICATIONS

Jungchak Ahn et al., A 1/4-inch 8Mpixel CMOS Image Sensor with 3D Backside-Illuminated 1.12 μm Pixel with Front-Side Deep-Trench Isolation and Vertical Transfer Gate, IEEE International Solid-State Circuits Conference, 2014, Session 7, Image Sensors, 7.1, pp. 124-125.

(Continued)

*Primary Examiner* — Michael Lebentritt
*Assistant Examiner* — Jordan Klein
(74) *Attorney, Agent, or Firm* — WPAT, PC

(57) ABSTRACT

An image sensor includes a semiconductor substrate, a plurality of photoelectric transducer devices, a dielectric isolating structure and a plurality of spacers. The semiconductor substrate has a backside surface and a front side surface opposite to the backside surface. The photoelectric transducer devices are disposed on the front side surface. The dielectric isolating structure extends downwards into the semiconductor substrate from the front side surface and penetrates through the backside surface, so as to from a grid structure and isolate the photoelectric transducer devices from each other. The spacers are disposed on a plurality of sidewalls of the grid structure.

9 Claims, 16 Drawing Sheets

(52) U.S. Cl.
CPC .. *H01L 27/14685* (2013.01); *H01L 27/14687* (2013.01); *H01L 27/14689* (2013.01); *H01L 27/14683* (2013.01)

(56) References Cited

U.S. PATENT DOCUMENTS

| | | | |
|---|---|---|---|
| 7,800,192 B2 | 9/2010 | Venezia et al. | |
| 8,471,348 B2 | 6/2013 | Ohba et al. | |
| 8,537,255 B2 | 9/2013 | Lee et al. | |
| 9,130,072 B1* | 9/2015 | Chen | H01L 27/1464 |
| 9,373,732 B2* | 6/2016 | Velichko | H01L 31/02327 |
| 2006/0180885 A1 | 8/2006 | Rhodes | |
| 2009/0200625 A1* | 8/2009 | Venezia | H01L 27/1463 257/432 |
| 2010/0060769 A1 | 3/2010 | Inuiya | |
| 2011/0266645 A1 | 11/2011 | Chao | |
| 2012/0009720 A1* | 1/2012 | Shim | H01L 27/14625 438/70 |
| 2012/0025199 A1 | 2/2012 | Chen et al. | |
| 2012/0153128 A1 | 6/2012 | Roy et al. | |
| 2012/0235266 A1* | 9/2012 | Ootsuka | H01L 27/14623 257/432 |
| 2012/0261781 A1 | 10/2012 | Hsu et al. | |
| 2013/0069190 A1 | 3/2013 | Kao et al. | |
| 2013/0200251 A1 | 8/2013 | Velichko | |
| 2014/0016012 A1* | 1/2014 | Oishi | H04N 5/372 348/311 |
| 2014/0035083 A1 | 2/2014 | Wan et al. | |
| 2014/0339615 A1 | 11/2014 | Wang et al. | |
| 2015/0015768 A1 | 1/2015 | Tanaka | |
| 2015/0028405 A1* | 1/2015 | Minami | H01L 27/14629 257/294 |
| 2015/0048467 A1 | 2/2015 | Weng et al. | |
| 2015/0115382 A1* | 4/2015 | Wu | H01L 27/14627 257/432 |
| 2015/0187826 A1* | 7/2015 | Suzuki | H01L 27/14625 348/281 |
| 2015/0228684 A1* | 8/2015 | Yamashita | H01L 27/14643 257/292 |
| 2015/0243694 A1* | 8/2015 | Ihara | H01L 27/14605 257/443 |
| 2015/0311248 A1* | 10/2015 | Lee | H01L 27/14645 257/432 |
| 2016/0043120 A1* | 2/2016 | Ahn | H01L 27/1463 257/229 |

OTHER PUBLICATIONS

T Shinohara et al., "Three-dimensional Structures for High Saturation Signals and Crosstalk Suppression in 1.20 μm Pixel Back-Illuminated CMOS Image Sensor," IEEE, 2013, pp. 27.4.1-27.4.4.

Y. Kitamura et al., "Suppression of Crosstalk by Using Backside Deep Trench Isolation for 1.12 μm Backside Illuminated CMOS Image Sensor," IEEE, 2012, pp. 24.2.1-24.2.4.

* cited by examiner

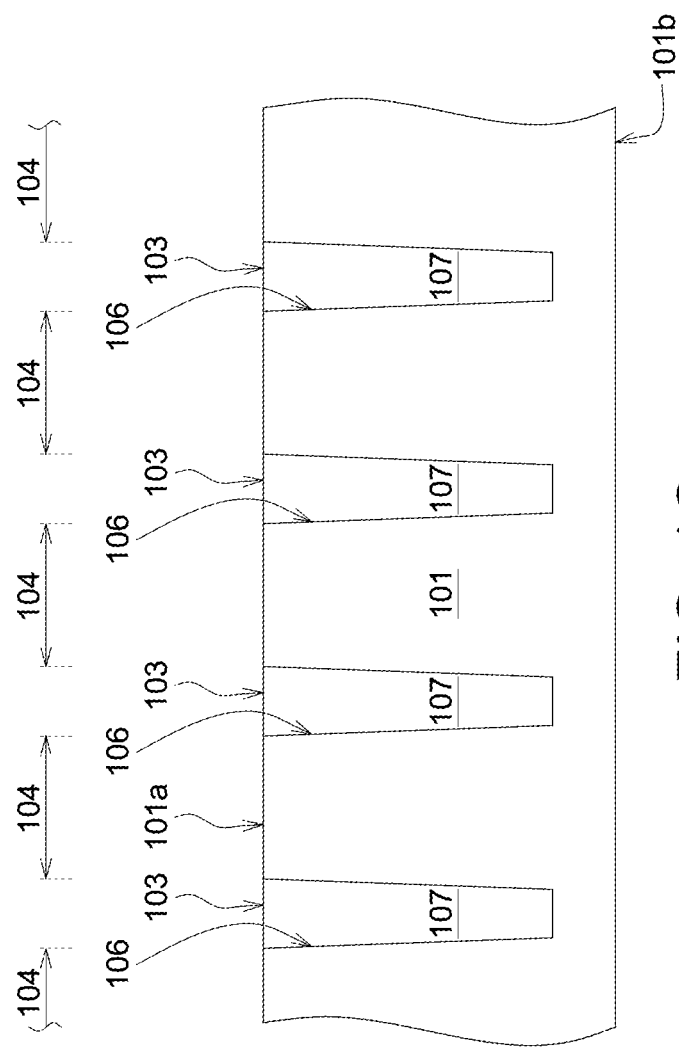

IMAGE SENSOR AND METHOD FOR FABRICATING THE SAME

This application is a divisional application of co-pending application Ser. No. 14/886,467, filed Oct. 19, 2015, which claims the benefit of People's Republic of China application Serial No. 201510477505.1, filed Aug. 6, 2015, the invention of which is incorporated by reference herein in its entirety.

TECHNICAL FIELD

The invention relates in general to a semiconductor device and the method for fabricating the same, and more particularly to an image sensor and the method for fabricating the same.

BACKGROUND

An image sensor, such as a metal-oxide-semiconductor (MOS) image sensor, is a device that converts an optical image into an electric signal and has been commonly used in the consumer electronics that require high resolution, such as digital cameras, apparatuses for applying personal communications service (PCS), game equipment, etc.

In order to realize higher resolution and satisfy the requirements of the consumer electronics. Pixel density of an image sensor may be increased and the size and pitch of the photoelectric transducer devices, such as photodiodes, that are involved in the image sensor may be shrank. However, the shrinkage in the pitch of the photoelectric transducer devices may cause electrical and optical crosstalk by which image resolution of the image sensor may thus be deteriorated; and the sensing images may be distorted.

In order to solve the problems, shallow trench isolation (STIs) disposed between two adjacent pixels have been applied to suppress the electrical and optical crosstalk. However, STIs cannot provide the image sensor enough barriers for electrical crosstalk suppression, especially in a backside illumination (BSI) image sensor, since the depth of the STIs is rather limited.

Therefore, there is a need of providing an improved image sensor and method for fabricating the same to obviate the drawbacks encountered from the prior art.

SUMMARY

According to one aspect of the present invention is to provide an image sensor, wherein the image sensor includes a semiconductor substrate, a plurality of photoelectric transducer devices, a dielectric isolating structure and a plurality of spacers. The semiconductor substrate has a backside surface and a front side surface opposite to the backside surface. The photoelectric transducer devices are disposed on the front side surface. The dielectric isolating structure extends downwards into the semiconductor substrate from the front side surface and penetrates through the backside surface, so as to from a grid structure and to isolate the photoelectric transducer devices from each other. The spacers are disposed on a plurality of sidewalls of the grid structure.

According to another aspect of the present invention, a method for fabricating an image sensor is disclosed, wherein the method includes steps as follows: Firstly, a semiconductor substrate having a plurality of photoelectric transducer devices and a dielectric isolating structure is provided, wherein the semiconductor substrate has a backside surface and a front side surface opposite to the backside surface; the photoelectric transducer devices are disposed on the front side surface; and the dielectric isolating structure extends downwards into the substrate from the front side surface and penetrating through the backside surface, so as to isolate the photoelectric transducer devices from each other. Subsequently, a portion of the semiconductor substrate is removed from the backside surface to expose a portion of the dielectric isolating structure, so as to form a grid structure protruding from the backside surface.

In accordance with the aforementioned embodiments of the present invention, an image sensor and method for fabricating the same are provided. In some embodiments, a dielectric isolating structure is formed at a front side surface of a semiconductor substrate and extending downwards into the semiconductor substrate in a manner of dividing the semiconductor substrate into a plurality of sub-pixel regions. Next, at least one photoelectric transducer device is formed on each of the sub-pixel regions. Subsequently, a portion of the semiconductor substrate is removed from the backside surface to expose a portion of the dielectric isolating structure, so as to form a grid structure protruding from the backside surface of the semiconductor substrate.

Since incident light coming from external circumstances, passing through the backside surface of the semiconductor substrate and directed to different sub-pixel regions can be confined in the corresponding sub-pixel region by the grid structure, and the photoelectric transducer devices are isolated from each other by the dielectric isolating structure, thus the photo-carriers generated by the photoelectric transducer devices disposed in one of the isolated sub-pixel regions cannot crosstalk with that generated by the photoelectric transducer devices disposed in the other sub-pixel regions adjacent to the isolated one.

In addition, because the grid structure is one portion of the dielectric isolating structure that is exposed from the backside surface of the substrate. The grid structure and the dielectric isolating structure can be regarded as an integrated structure formed by the same patterning process with an identical reticle. In other words, the grid structure can be form on the backside surface of the substrate without using additional reticles and alignment marks. As a result, the process for fabricating the image sensor can be simplified; more precise process control and reduced manufacturing cost can be obtained.

BRIEF DESCRIPTION OF THE DRAWINGS

The above objects and advantages of the present invention will become more readily apparent to those ordinarily skilled in the art after reviewing the following detailed description and accompanying drawings, in which:

FIGS. 1A-1G are cross-sectional views illustrating the process for fabricating a MOS image sensor in accordance with one embodiment of the present invention;

DETAILED DESCRIPTION

Figure 1A:
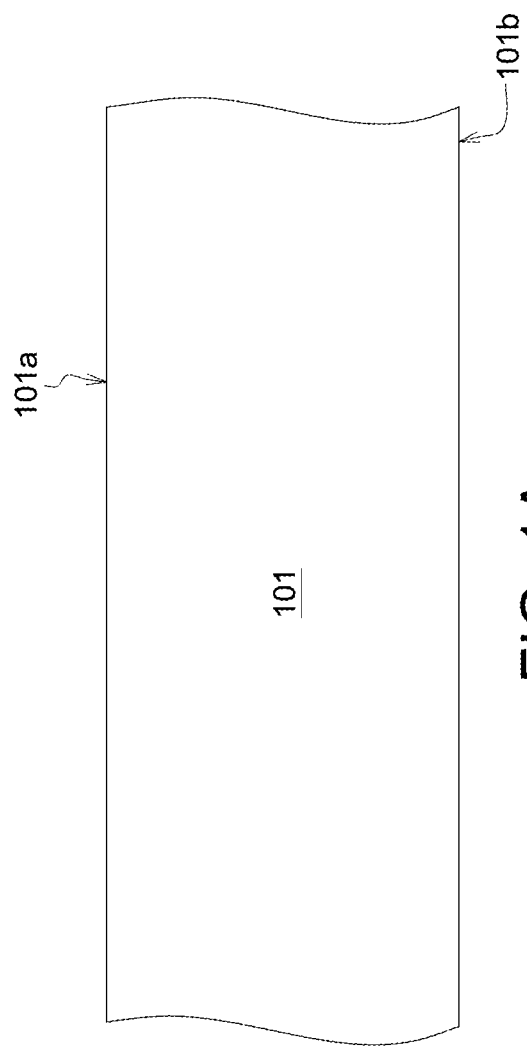
Figure 1B:
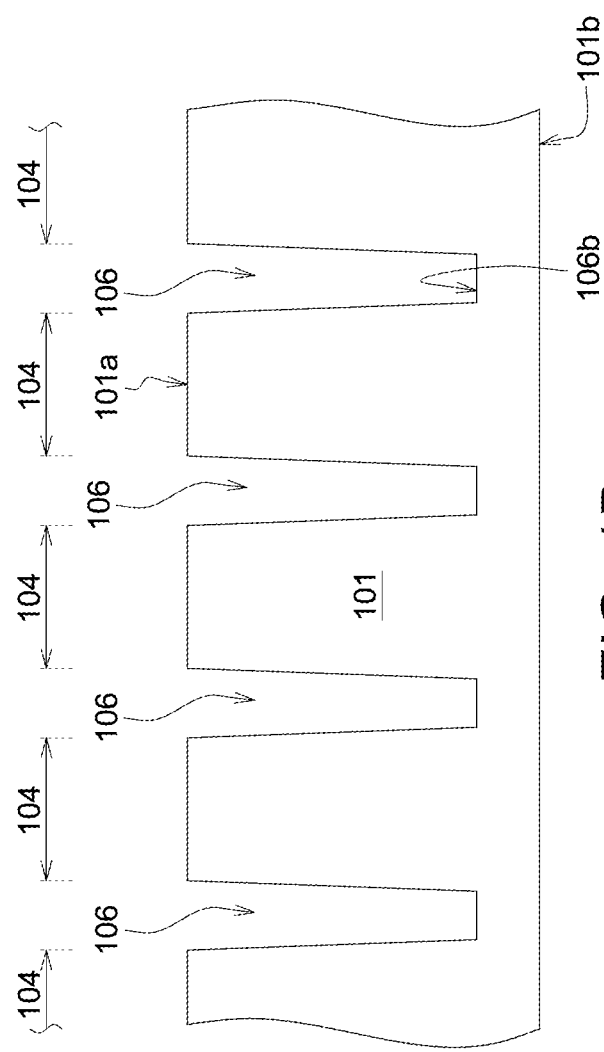

The embodiments as illustrated below provide an image sensor and the method for fabricating the same to solve the problems of electrical and optical crosstalk encountered from the prior art. The present invention will now be described more specifically with reference to the following embodiments and accompanying drawings illustrating the structure and method for fabricating the image sensor.

It is to be noted that the following descriptions of preferred embodiments of this invention are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present invention. In addition, the illustrations may not be necessarily be drawn to scale, and the identical elements of the embodiments are designated with the same reference numerals.

FIGS. 1A-1G are cross-sectional views illustrating the process for fabricating a MOS image sensor 100 in accordance with one embodiment of the present invention. Firstly, a semiconductor substrate 101 is provided (see FIG. 1A). In some embodiments of the present invention, the semiconductor substrate 101 may be made of a semiconductor material, such as silicon (Si), germanium (Ge) or a compound semiconductor material, such as gallium arsenide (GaAs). In some other embodiments of the present invention, the semiconductor substrate 101 may be a silicon-on-insulator (SOI) wafer. In the present embodiment, the semiconductor substrate 101 preferably is a Si wafer.

A dielectric isolating structure 103 is then formed in the semiconductor substrate 101 to divide the semiconductor substrate 101 into a plurality of sub-pixel regions 104. In the present embodiment, the dielectric isolating structure 103 is a deep trench isolation structure. The forming of the dielectric isolating structure 103 includes steps as follows: An etching process, such as a reactive ion etching (RIE) process, is firstly performed on the front side surface 101a of the semiconductor substrate 101, to form at least one trench(es) 106 extending downwards into the semiconductor substrate 101 from the front side surface 101a of the semiconductor substrate 101, so as to divide the semiconductor substrate 101 into a plurality of sub-pixel regions 104 (see FIG. 1B).

Next, a dielectric material 107 is formed on the front side surface 101a of the semiconductor substrate 101 to fill the trenches 106. In some embodiments of the present invention, each of the trenches 106 has a depth substantially less than the thickness of the semiconductor substrate 101. In other words, the trenches 106 does not penetrating through the backside surface 101b of the semiconductor substrate 101 (see FIG. 1C). The dielectric material 107 may be an anti-reflecting material including silicon oxide and may be filled in the trenches 106 with a single layer structure or a multi-layer structure. In the present embodiment, the dielectric material 107 may include silicon dioxide ($SiO_2$). The dielectric isolating structure 103 made of the dielectric material 107 is a deep trench isolation structure configured by one single layer of anti-reflecting material including $SiO_2$, or a deep trench isolation structure configured by multi-layers of anti-reflecting material including a $SiO_2$/silicon nitride (SiN)/$SiO_2$/SiN/SiON stacked structure.

Figure 1D:
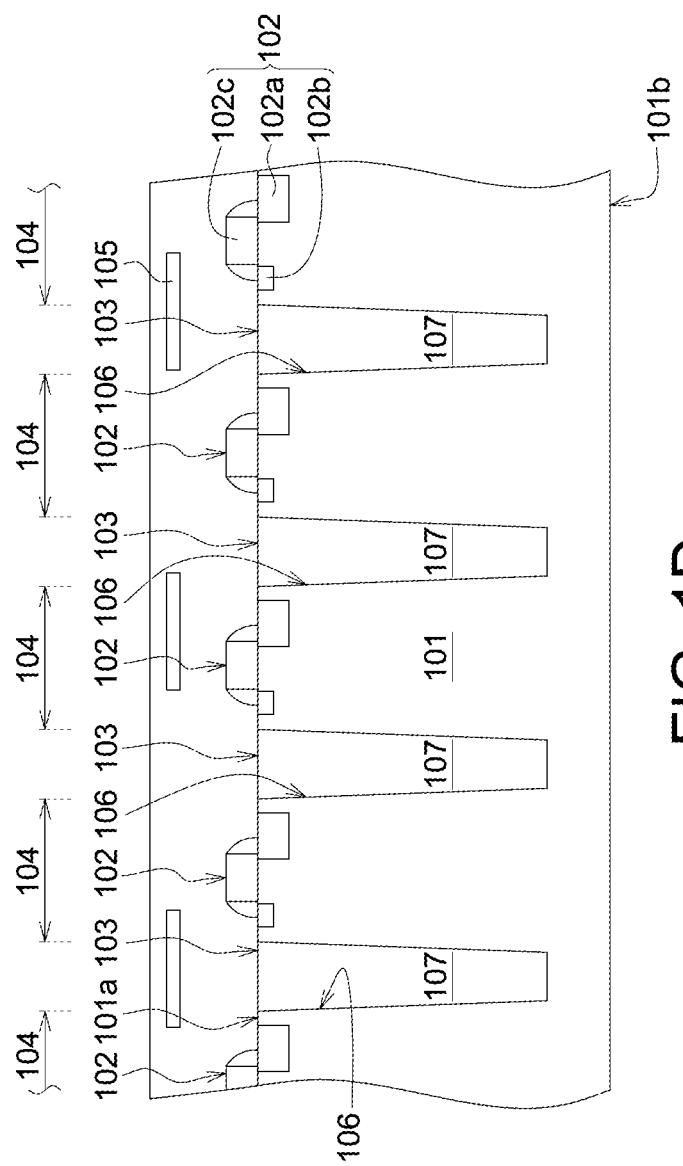

A series front side processes are then performed on the front side surface 101a of the semiconductor substrate 101 to form at least one photoelectric transducer device 102, wire connection and at least one pad 105 on each of the sub-pixel regions 104 (see FIG. 1D). In some embodiments of the present invention, each of the sub-pixel regions 104 that are separated by the dielectric isolating structure 103 may have single one photoelectric transducer device 102. However, in some other embodiments of the present invention, each of the sub-pixel regions 104 that are separated by the dielectric isolating structure 103 may have a plurality of photoelectric transducer devices 102.

The forming of the photoelectric transducer devices 102 comprises steps as follows: a plurality of ion implantation process are performed on the front side surface 101a of the semiconductor substrate 101 to form at least one photo diode (PD) 102a and a floating drain region 102b at each of the sub-pixel regions 104, wherein the floating drain region 102b is corresponding to and separated from the PD 102a. Subsequently, a gate structure 102c corresponding to the PD 102a and the PD 102a is formed at each of the sub-pixel regions 104 on the front side surface 101a of the semiconductor substrate 101, wherein the gate structure 102c is disposed adjacent to the PD 102a and the PD 102b.

Figure 1E:
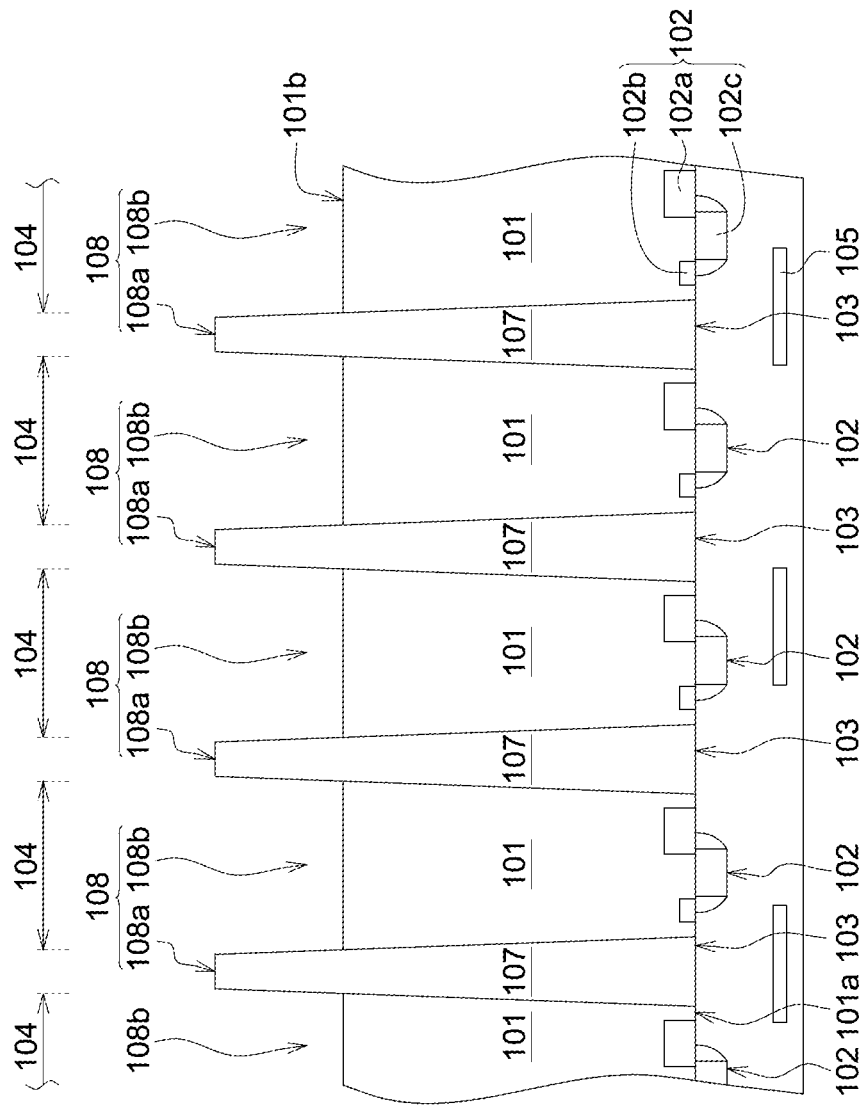
Figure 1F:
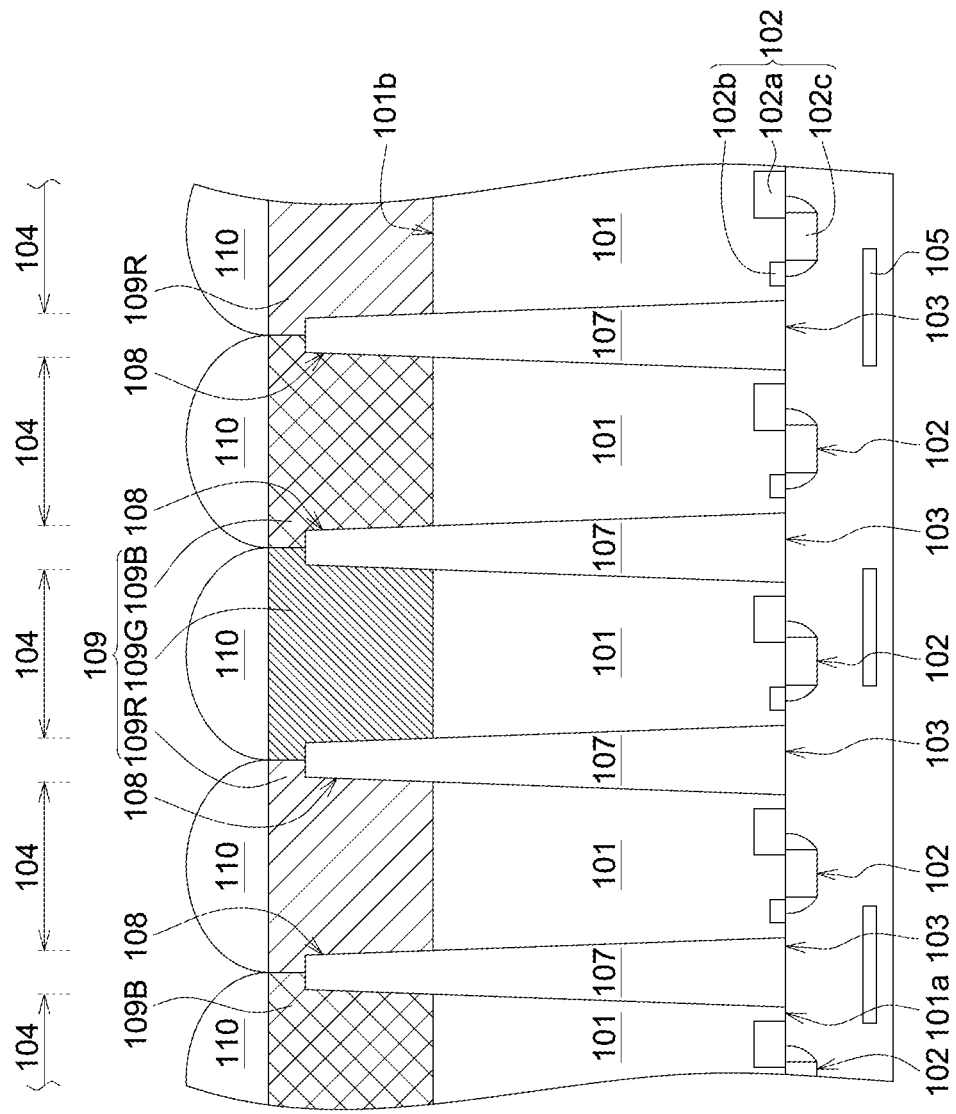

Next, a portion of the semiconductor substrate 101 is removed from the backside surface 101b to expose a portion of the dielectric isolating structure 103, so as to form a grid structure 108 protruding from the backside surface 101b of the semiconductor substrate 101 (see FIG. 1E). In some embodiments of the present invention, the process for removing the portion of the semiconductor substrate 101 includes steps as follows: A thinning process, such as a chemical-mechanical polishing (CMP), is firstly performed on the backside surface 101b of the semiconductor substrate 101 to thin down the semiconductor substrate 101, so as to make the semiconductor substrate 101 has a thickness substantially less than 3 μm. An etching process is then performed on the backside surface 101b of the thinned semiconductor substrate 101 to remove a portion of the semiconductor substrate 101. For example, a wet etching process using tetramethylammonium hydroxide (TMAH) or hydrofluoric acid/nitric acid/acetic acid solution (HNA) as the etchant is performed on the backside surface 101b of the semiconductor substrate 101 to remove a portion of the semiconductor substrate 101 from the backside surface 101b, so as to expose a portion of the dielectric isolating structure 103 and to regard to the exposed portion of the dielectric isolating structure 103 as the grid structure 108.

Figure 2:
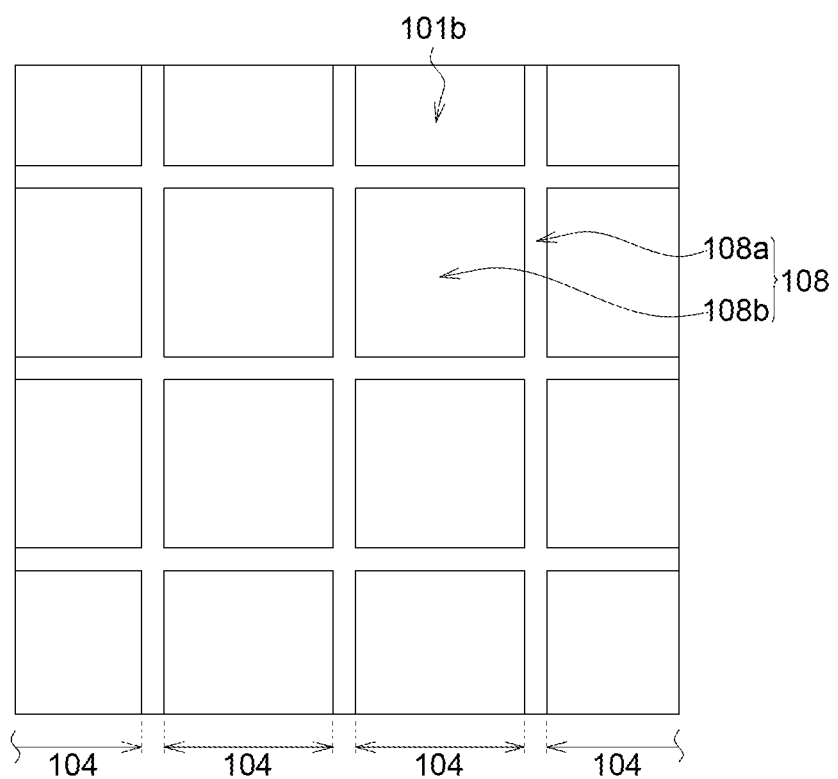
FIG. 2 is a top view illustrating a grid structure in accordance with one embodiment of the present invention.

The grid structure 108 formed by the wet etching process includes a frame portion 108a consisting of the exposed portion of the dielectric isolating structure 103 and a plurality of recess portions 108b defined by the frame portion 108a and the backside surface 101b of the semiconductor substrate 101, wherein each of the recess portions 108b is corresponding to one of the sub-pixel region 104. For example, FIG. 2 is a top view illustrating a grid structure 108 in accordance with one embodiment of the present invention. In the present embodiment, the grid structure 108 may be arranged with rows and columns to form a chessboard structure. However, the arrangement of the grid structure 108 may not limited in this regard. In other embodiments, the arrangement of the grid structure 108 may varied in accordance with different layout designs (topographies) of the photoelectric transducer devices 102.

Thereinafter, a color filter (CF) 109 is formed on the grid structure 108 and the backside surface 101b of the semiconductor substrate 101, and a plurality of micro lenses 110 are then formed on the CF 109. In the present embodiment, the CF 109 includes a plurality of color filtering elements, e.g. including three color filtering elements 109R, 109G and 109B; and each one of which is corresponding to each of the sub-pixel regions 104. For example, each of the sub-pixel regions 104 may have one color filtering element; and the color filtering elements 109R, 109G and 109B may at least partially extend into the corresponding recess portion 108b of the grid structure 108 (see FIG. 1F). The micro lenses 110 preferably are made of glass, polymer and plastic material (such as, epoxy), propylene glycol mono-methyl ether acetate (PGMEA) or the arbitrary combinations thereof.

Figure 1G:
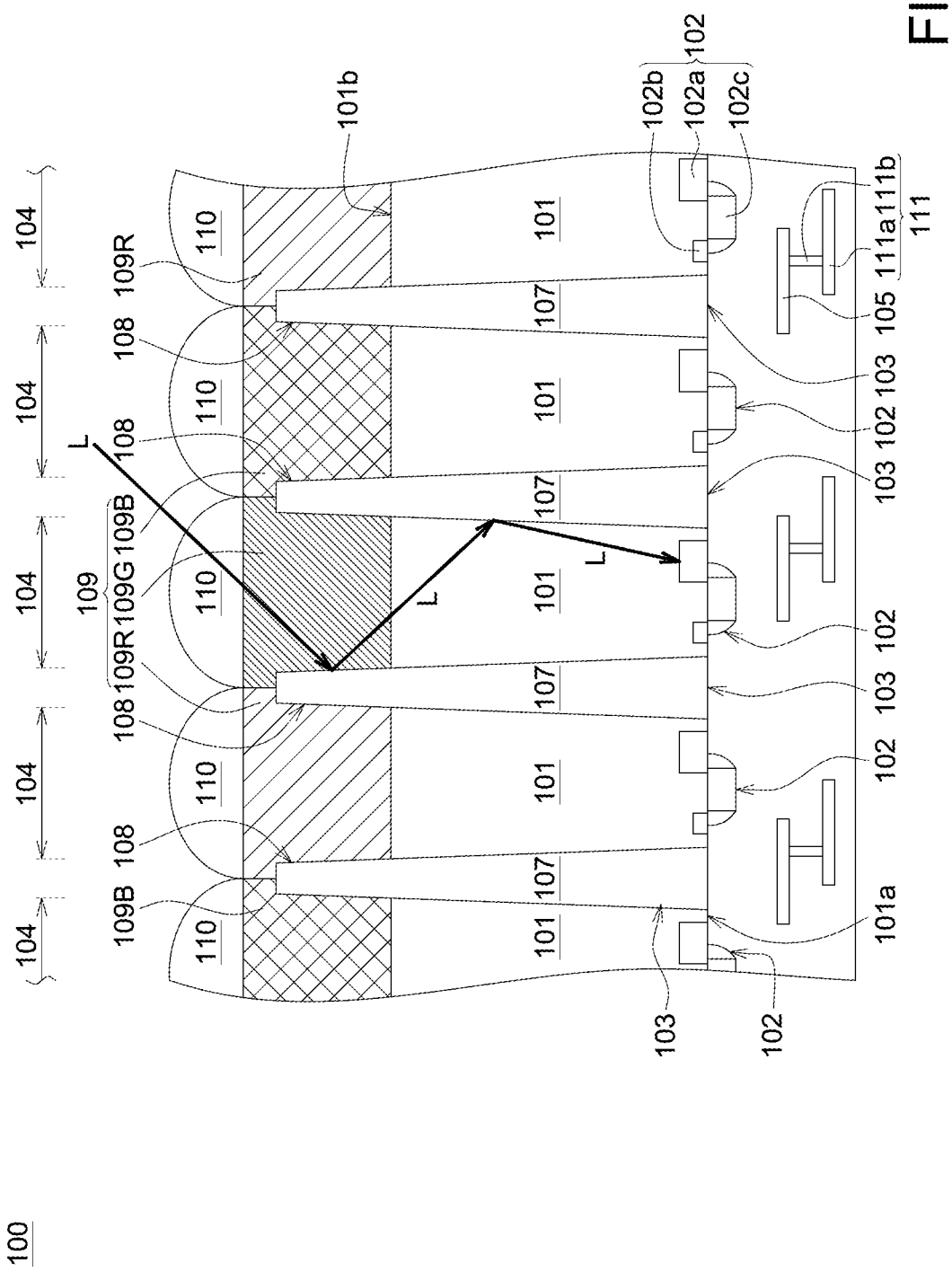

After a series of back-end-of-line (BEOL) processes, such as a metal damascene process used to form a metal interconnection structure 111 on the front surface 101a of the semiconductor substrate 101, a metal wiring process and a chip packing process, are subsequently performed, the image sensor 100 as shown in FIG. 1G can be accomplished. In the present embodiment, the metal interconnection structure 111 includes a plurality of metal wire layout layers 111a and a plurality of via plugs 111b used to electrically connect the metal wire layout layers 111a and the pads 105.

Incident light L coming from external circumstances, passing through the backside surface 101b of the semiconductor substrate 101 and then directed to each of the sub-pixel regions 104 can be shielded and reflected by the grid structure 108 protruding from the backside surface 101b and the portion of the dielectric isolating structure 103 buried in the semiconductor substrate 101, whereby the incident light L can be confined in the corresponding sub-pixel regions 104, and optical crosstalk occurring between different sub-pixel regions 104 can be avoided. In addition, since the photoelectric transducer devices 102 are isolated from each other by the dielectric isolating structure 103, thus the photo-carriers generated by the photoelectric transducer devices 102 disposed in one of the isolated sub-pixel regions 104 cannot crosstalk with that generated by the photoelectric transducer devices 102 disposed in the other sub-pixel regions 104 adjacent to the isolated one.

Figure 3A:
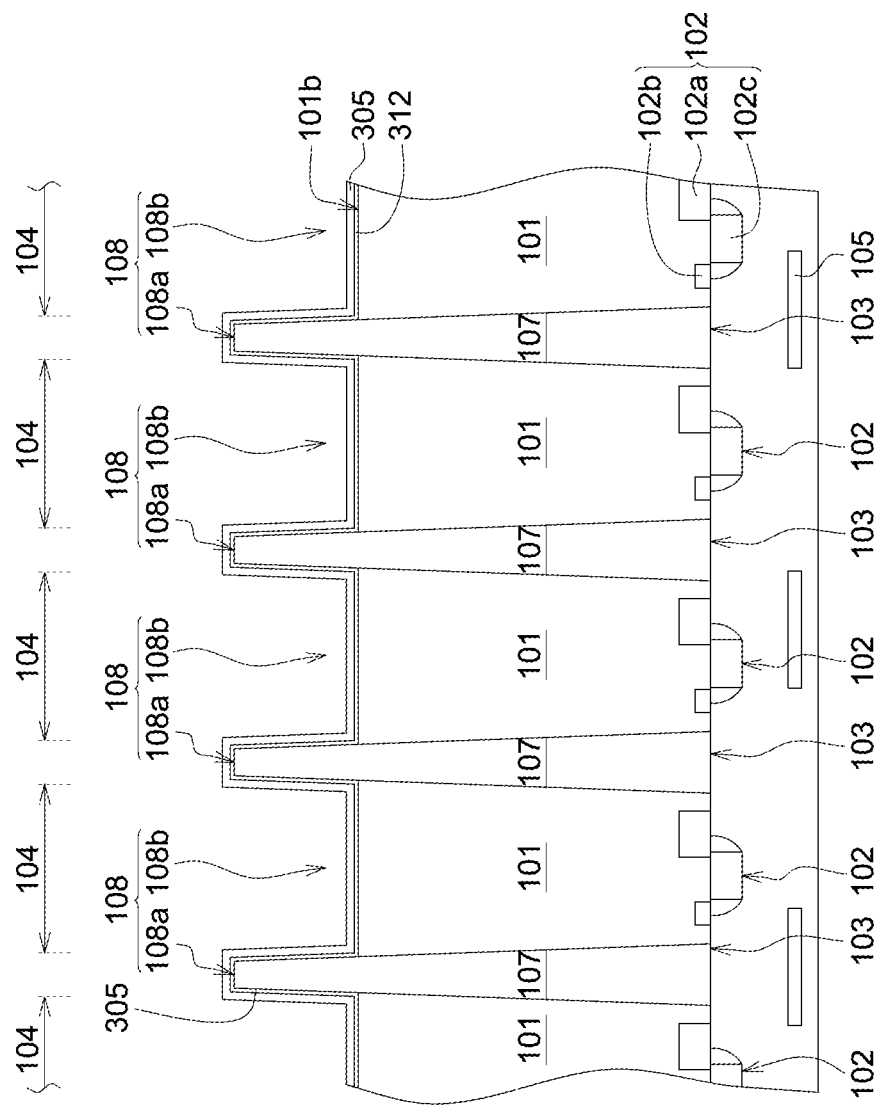
FIGS. 3A-3C are cross-sectional views partially illustrating the process for fabricating a MOS image sensor in accordance with another embodiment of the present invention.
Figure 3B:
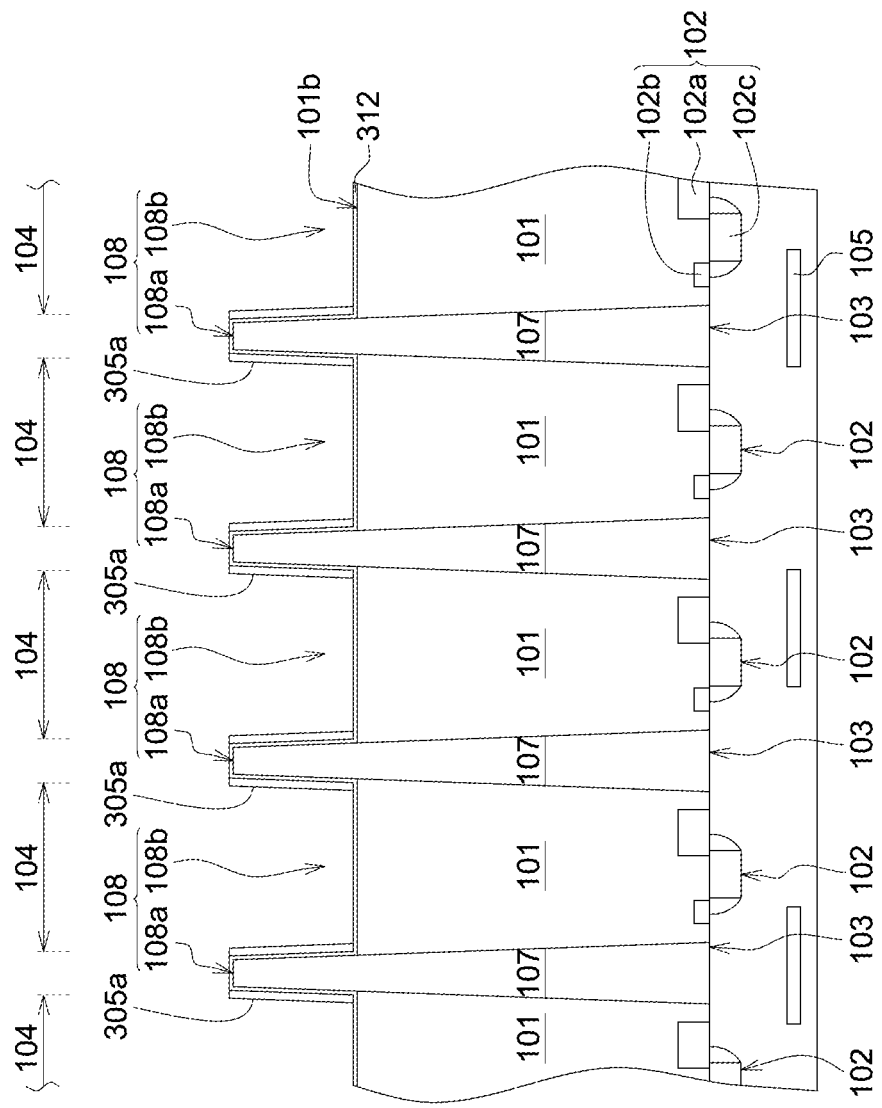
Figure 3C:
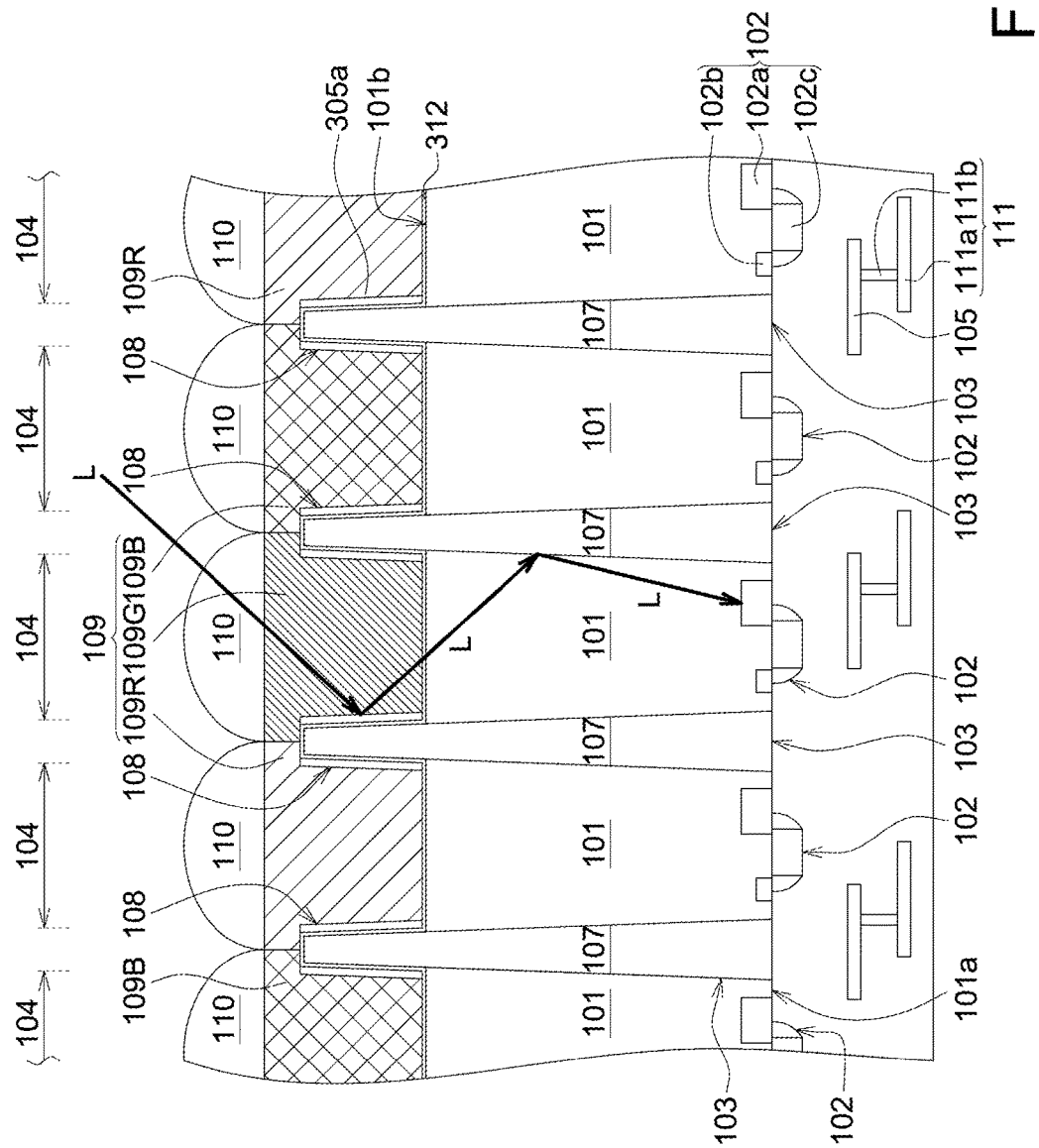

FIGS. 3A-3C are cross-sectional views partially illustrating the process for fabricating a MOS image sensor 300 in accordance with another embodiment of the present invention. The structure of the MOS image sensor 300 and the process for fabricating the same are similar to that of the MOS image sensor 100, except that the MOS image sensor 300 further includes spacers 305a formed on the grid structure 108 prior to the forming of the CF 109. Since the processing steps prior to the forming of the grid structure 108 has described above, thus the identical elements and processing steps will not be redundantly repeated here, and the process for fabricating the MOS image sensor 300 may start to describe form the forming of the spacers 305a.

In the present embodiment, the forming of the spacer 305a includes steps as follows: Firstly, an insulating layer 312 and a capping layer 305 are formed in sequence on the structure depicted in FIG. 1E to blanket over the frame portion 108a of the grid structure 108 and the portion of the backside surface 101b of the semiconductor substrate 101 used to define the recess portions 108b of the grid structure 108 (see FIG. 3A). An anisotropic etching process, such as a RIE process, is then performed to remove a portion of the capping layer 305, so as to form a plurality of spacers 305a on the sidewalls of the frame portion 108a of the grid structure 108 (see FIG. 3B). In some embodiments of the present invention, the insulating layer 312 may be a $SiO_2$ layer or a SiN layer. The spacers 305a are made of a light shielding material selected from a group consisting of metal (such as, copper (Cu), silver (Ag), aluminum (Al), titanium (Ti), tungsten (W), tantalum (Ta) etc.), metal oxide (such as, hafnium oxide ($HfO_2$), tantalum pentoxide ($Ta_2O_5$) etc.), metal nitride (such as, titanium nitride (TiN) etc.), alloys (such as, aluminum alloys) and the arbitrary combinations thereof.

Thereinafter, a CF 109 is formed on the grid structure 108 and the backside surface 101b of the semiconductor substrate 101, and a plurality of micro lenses 110 are then formed on the CF 109. After a series of back-end-of-line (BEOL) processes, such as a metal damascene process used to form a metal interconnection structure 111 on the front surface 101a of the semiconductor substrate 101, a metal wiring process and a chip packing process, are subsequently performed, the image sensor 300 as shown in FIG. 3C can be accomplished.

Incident light L coming from external circumstances, passing through the backside surface 101b of the semiconductor substrate 101 and then directed to each of the sub-pixel regions 104 can be shielded and reflected by the grid structure 108 protruding from the backside surface 101b, the spacers 305a and the portion of the dielectric isolating structure 103 buried in the semiconductor substrate 101, whereby the incident light L can be confined in the corresponding sub-pixel regions 104, and optical crosstalk occurring between different sub-pixel regions 104 can be avoided. In addition, since the photoelectric transducer devices 102 are isolated from each other by the dielectric isolating structure 103, thus the photo-carriers generated by the photoelectric transducer devices 102 disposed in one of the isolated sub-pixel regions 104 cannot crosstalk with that generated by the photoelectric transducer devices 102 disposed in the other sub-pixel regions 104 adjacent to the isolated one.

FIGS. 4A-4D are cross-sectional views partially illustrating the process for fabricating a MOS image sensor 400 in yet accordance with another embodiment of the present invention. The structure of the MOS image sensor 400 and the process for fabricating the same are similar to that of the MOS image sensor 100, except that the dielectric isolating structure 403 of the MOS image sensor 400 is different from that of the MOS image sensor 100. Since the processing steps prior to the forming of dielectric isolating structure 403 has described above, thus the identical elements and processing steps will not be redundantly repeated here, and the process for fabricating the MOS image sensor 400 may start to describe form the forming of the dielectric isolating structure 403.

In the present embodiment, the forming of the dielectric isolating structure 403 includes steps as follows: Firstly, a first dielectric layer 403a is formed on the structure depicted in FIG. 1B to blanket over the sidewalls 106a and bottoms 106b of the trenches 106 (see FIG. 4A). An embedded light shielding layer 403b is then formed on the first dielectric layer 403a (see FIG. 4B). A second dielectric layer 403c is next formed on the embedded light shielding layer 403b to make the embedded light shielding layer 403b disposed between the first dielectric layer 403a and the second dielectric layer 403c (see FIG. 4C).

In some embodiments of the present invention, the first dielectric layer 403a and the second dielectric layer 403c may be two single layer structures respectively made of SiO$_2$ and SiN. In some other embodiments, the first dielectric layer 403a and the second dielectric layer 403c may be two SiO$_2$/SiN or SiO$_2$/SiON bilayer structures. In yet other embodiments, the first dielectric layer 403a and the second dielectric layer 403c may be two multi-layer structures, such as two SiO$_2$/SiN/SiO$_2$ or SiO$_2$/SiON/SiO$_2$ tri-layer structures. The embedded light shielding layer 403b can be made by a material selected from a group consisting of SiN, SiON, poly-silicon, metal (such as, Cu, Ag, Al, Ti, W, Ta etc.), metal oxide (such as, HfO$_2$, Ta$_2$O$_5$ etc.), metal nitride (such as, TiN etc.) and the arbitrary combinations thereof.

Figure 4A:
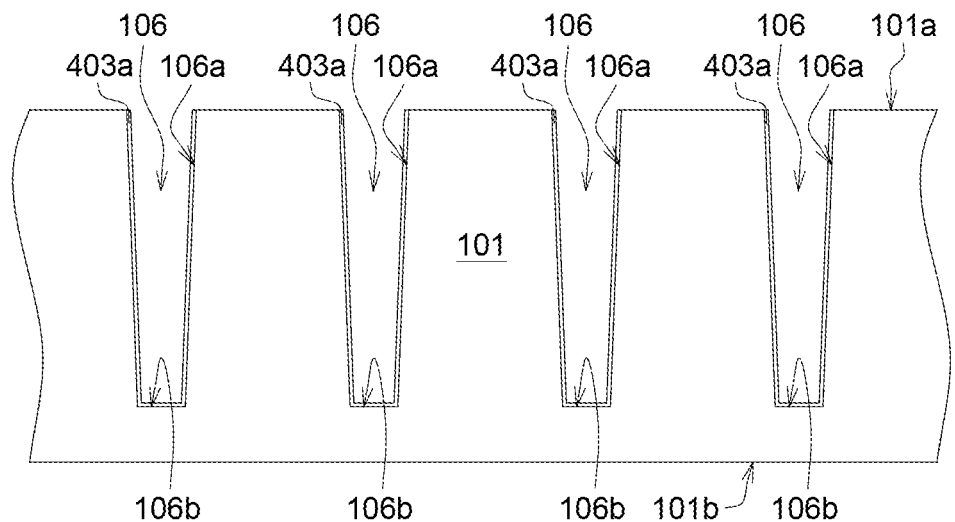
FIGS. 4A-4D are cross-sectional views partially illustrating the process for fabricating a MOS image sensor in accordance with yet another embodiment of the present invention.
Figure 4B:
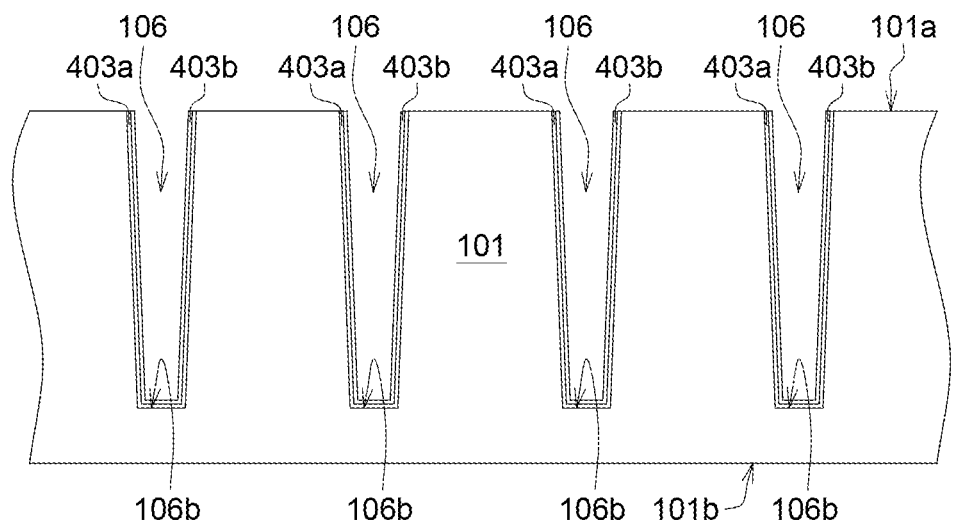
Figure 4C:
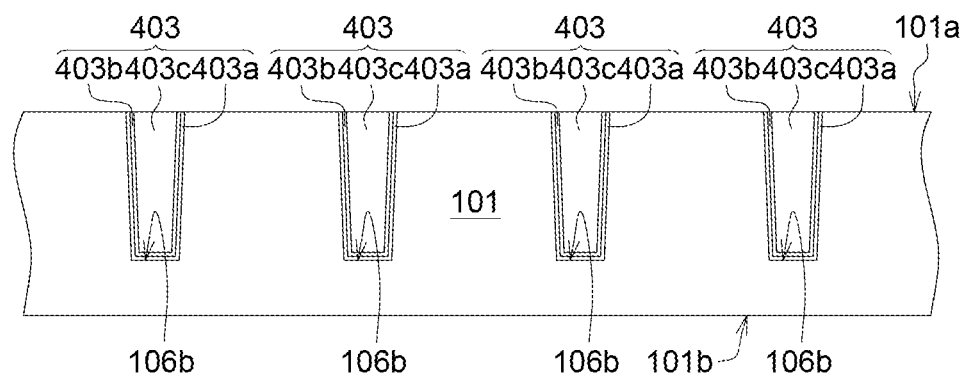
Figure 4D:
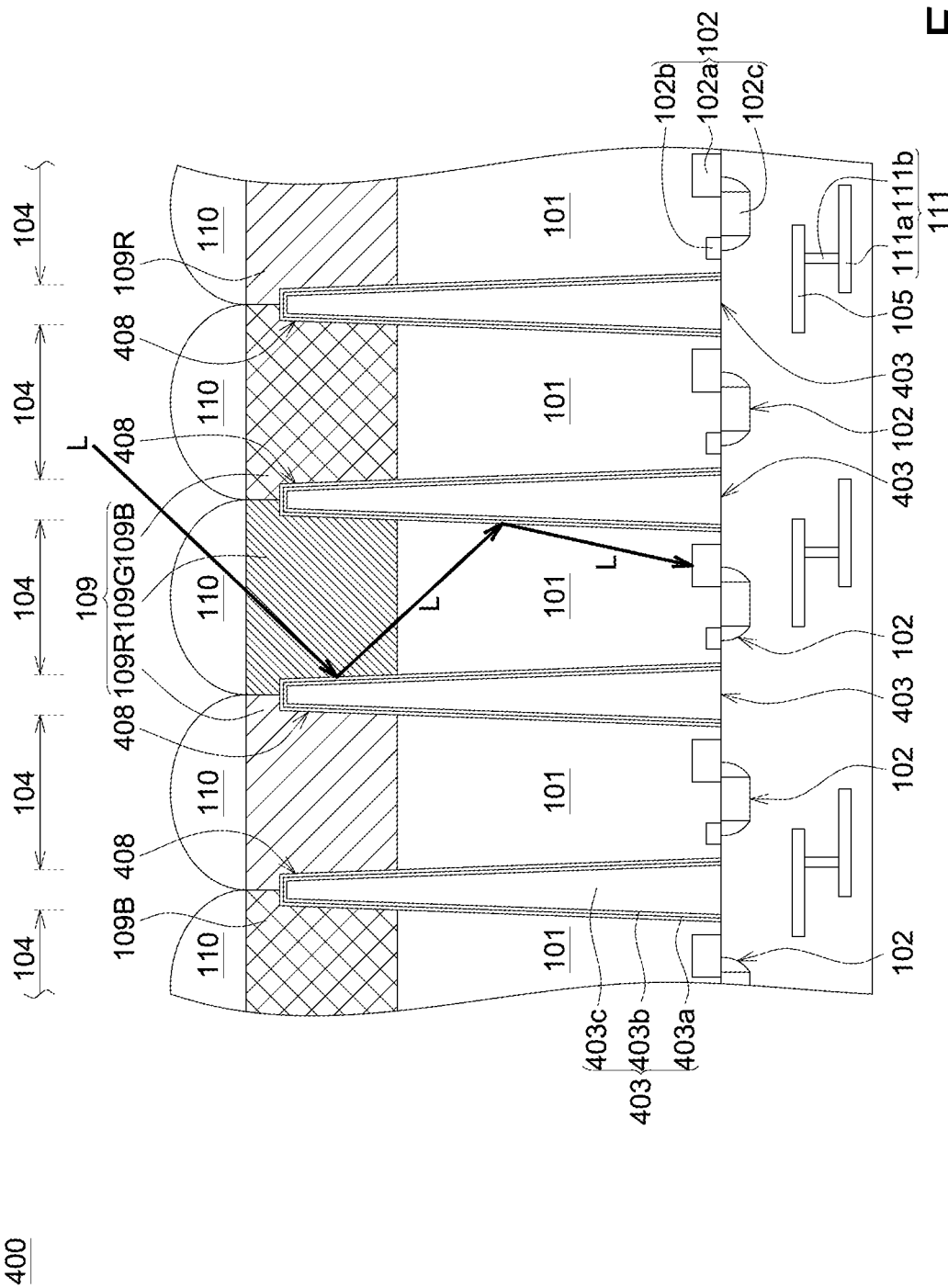

A series front side processes are then performed on the front side surface 101a of the semiconductor substrate 101 to form at least one photoelectric transducer device 102 on each of the sub-pixel regions 104. Next, a portion of the semiconductor substrate 101 is removed from the backside surface 101b to expose a portion of the dielectric isolating structure 403, so as to form a grid structure 408 protruding from the backside surface 101b of the semiconductor substrate 101. Thereinafter, a CF 109 is formed on the grid structure 408 and the backside surface 101b of the semiconductor substrate 101, and a plurality of micro lenses 110 are then formed on the CF 109. Subsequently, after a series of back-end-of-line (BEOL) processes, such as a metal damascene process used to form a metal interconnection structure 111 on the front surface 101a of the semiconductor substrate 101, a metal wiring process and a chip packing process, are performed, the image sensor 400 as shown in FIG. 4D can be accomplished.

Incident light L coming from external circumstances, passing through the backside surface 101b of the semiconductor substrate 101 and then directed to each of the sub-pixel regions 104 can be shielded and reflected by the grid structure 408 protruding from the backside surface 101b and the portion of the dielectric isolating structure 403 buried in the semiconductor substrate 101, whereby the incident light L can be confined in the corresponding sub-pixel regions 104, and optical crosstalk occurring between different sub-pixel regions 104 can be avoided. In addition, since the photoelectric transducer devices 102 are isolated from each other by the dielectric isolating structure 403, thus the photo-carriers generated by the photoelectric transducer devices 102 disposed in one of the isolated sub-pixel regions 104 cannot crosstalk with that generated by the photoelectric transducer devices 102 disposed in the other sub-pixel regions 104 adjacent to the isolated one.

Figure 5A:
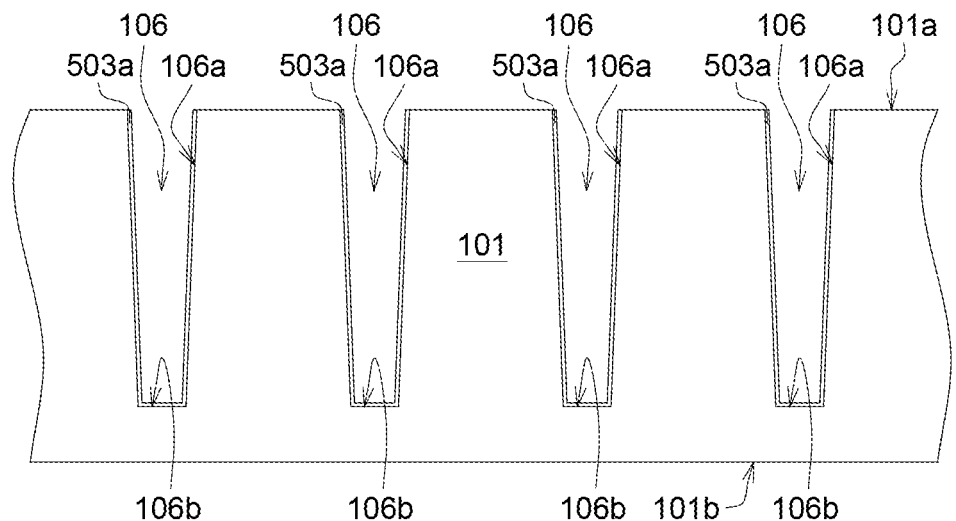
FIGS. 5A-5C are cross-sectional views partially illustrating the process for fabricating a MOS image sensor in accordance with yet another embodiment of the present invention.
Figure 5B:
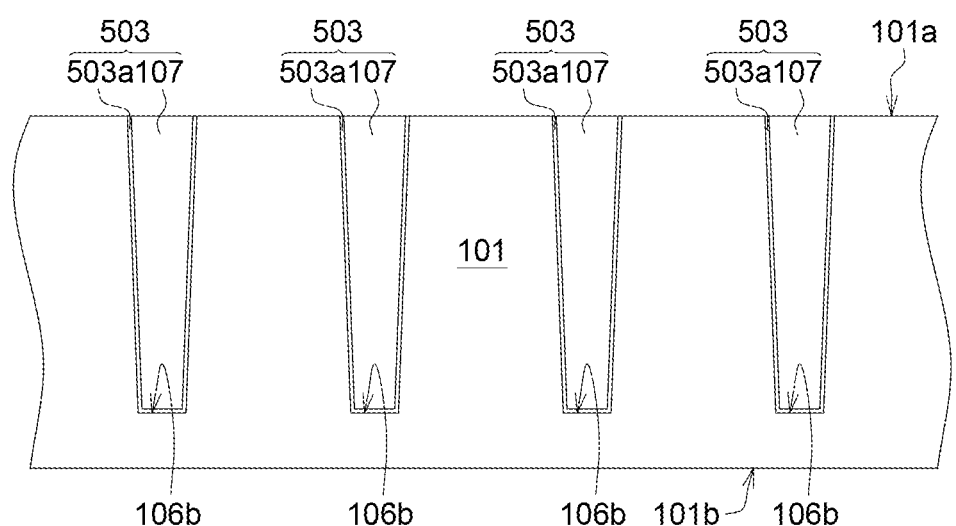
Figure 5C:
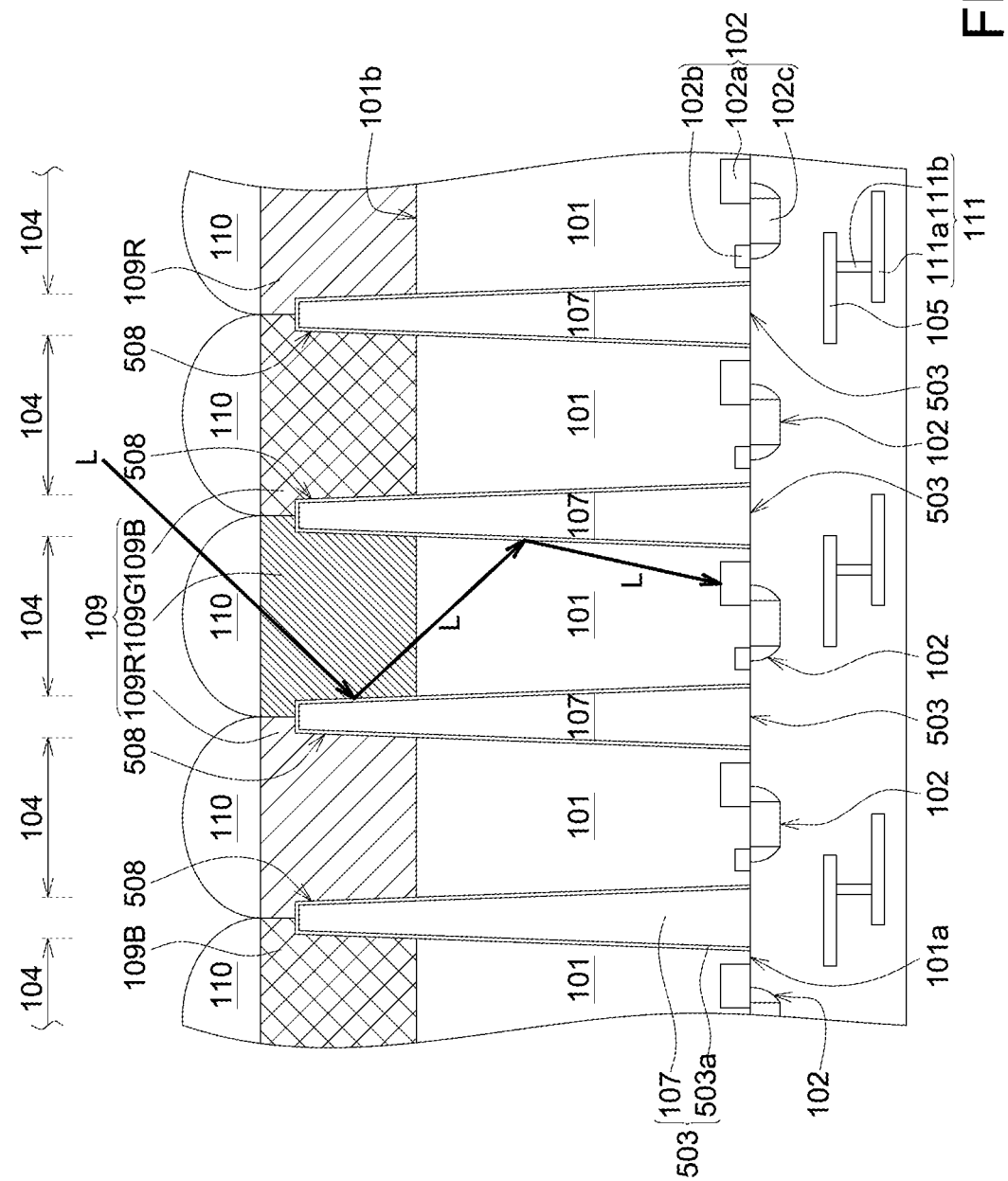

FIGS. 5A-5C are cross-sectional views partially illustrating the process for fabricating a MOS image sensor 500 in yet accordance with another embodiment of the present invention. The structure of the MOS image sensor 500 and the process for fabricating the same are similar to that of the MOS image sensor 100, except that the dielectric isolating structure 503 of the MOS image sensor 500 is different from that of the MOS image sensor 100. Since the processing steps prior to the forming of dielectric isolating structure 503 has described above, thus the identical elements and processing steps will not be redundantly repeated here, and the process for fabricating the MOS image sensor 500 may start to describe form the forming of the dielectric isolating structure 503.

In the present embodiment, the forming of the dielectric isolating structure 503 includes steps as follows: Firstly, a light shielding liner 503a is formed on the structure depicted in FIG. 1B to blanket over the sidewalls 106a and bottoms 106b of the trenches 106 (see FIG. 5A). Next, a dielectric material 107 is formed to fill the trenches 106 (see FIG. 5B). The light shielding liner 503a can be made by a material selected from a group consisting of SiN, poly-silicon, metal oxide (such as, HfO$_2$, Ta$_2$O$_5$ etc.), metal nitride (such as, TiN etc.) and the arbitrary combinations thereof.

A series front side processes are then performed on the front side surface 101a of the semiconductor substrate 101 to form at least one photoelectric transducer device 102 on each of the sub-pixel regions 104. Next, a portion of the semiconductor substrate 101 is removed from the backside surface 101b to expose a portion of the dielectric isolating structure 503, so as to form a grid structure 508 protruding from the backside surface 101b of the semiconductor substrate 101. Thereinafter, a CF 109 is formed on the grid structure 508 and the backside surface 101b of the semiconductor substrate 101, and a plurality of micro lenses 110 are then formed on the CF 109. Subsequently, after a series of back-end-of-line (BEOL) processes, such as a metal damascene process used to form a metal interconnection structure 111 on the front surface 101a of the semiconductor substrate 101, a metal wiring process and a chip packing process, are performed, the image sensor 500 as shown in FIG. 5C can be accomplished.

Incident light L coming from external circumstances, passing through the backside surface 101b of the semiconductor substrate 101 and then directed to each of the sub-pixel regions 104 can be shielded and reflected by the grid structure 508 protruding from the backside surface 101b and the portion of the dielectric isolating structure 503 buried in the semiconductor substrate 101, whereby the incident light L can be confined in the corresponding sub-pixel regions 104, and optical crosstalk occurring between different sub-pixel regions 104 can be avoided. In addition, since the photoelectric transducer devices 102 are isolated from each other by the dielectric isolating structure 503, thus the photo-carriers generated by the photoelectric transducer devices 102 disposed in one of the isolated sub-pixel regions 104 cannot crosstalk with that generated by the photoelectric transducer devices 102 disposed in the other sub-pixel regions 104 adjacent to the isolated one.

In accordance with the aforementioned embodiments of the present invention, an image sensor and method for fabricating the same are provided. In some embodiments, a dielectric isolating structure is formed at a front side surface of a semiconductor substrate and extending downwards into the semiconductor substrate in a manner of dividing the semiconductor substrate into a plurality of sub-pixel regions. Next, at least one photoelectric transducer device is formed on each of the sub-pixel regions. Subsequently, a portion of the semiconductor substrate is removed from the backside surface to expose a portion of the dielectric isolating structure, so as to form a grid structure protruding from the backside surface of the semiconductor substrate. A CF 109 and a plurality of micro lenses are then formed on the grid structure 108 and the backside surface 101b of the semiconductor substrate in sequence, wherein the CF extends into the grid structure 108.

Since incident light coming from external circumstances, passing through the backside surface of the semiconductor substrate and directed to different sub-pixel regions can be confined in the corresponding sub-pixel region by the grid structure, and the photoelectric transducer devices are isolated from each other by the dielectric isolating structure, thus the photo-carriers generated by the photoelectric transducer devices disposed in one of the isolated sub-pixel regions cannot crosstalk with that generated by the photoelectric transducer devices disposed in the other sub-pixel regions adjacent to the isolated one.

In addition, because the grid structure is one portion of the dielectric isolating structure that is exposed from the backside surface of the substrate. The grid structure and the dielectric isolating structure can be regarded as an integrated structure formed by the same patterning process with an identical reticle. In other words, the grid structure can be form on the backside surface of the substrate without using additional reticles and alignment marks. As a result, the process for fabricating the image sensor can be simplified; more precise process control and reduced manufacturing cost can be obtained.

It will be apparent to those skilled in the art that various modifications and variations can be made to the disclosed embodiments. It is intended that the specification and examples be considered as exemplary only, with a true scope of the invention being indicated by the following claims and their equivalents.

What is claimed is:

1. An image sensor, comprising:
    a semiconductor substrate having a backside surface and a front side surface opposite to the backside surface;
    a plurality of photoelectric transducer devices disposed on the front side surface;
    a dielectric isolating structure extending downwards into the semiconductor substrate from the front side surface and penetrating through the backside surface, so as to from a grid structure and isolate the photoelectric transducer devices from each other;
    a plurality of spacers disposed on a plurality of sidewalls of the grid structure protruding from the backside surface; and
    a color filter (CF) formed on the grid structure and at least partially extending into recesses to directly contacting with the semiconductor substrate.

2. The image sensor according to claim 1, wherein the recess are defined by the grid structure and the semiconductor substrate, and each of the recesses is corresponding to a sub-pixel region that are separated by the dielectric isolating structure.

3. The image sensor according to claim 2, further comprising:
    a plurality of micro lenses disposed on the CF.

4. The image sensor according to claim 1, wherein the dielectric isolating structure comprises a material selected from a group consisting of silicon oxide, silicon nitride (SiN), silicon oxynitride (SiON) and arbitrary combinations thereof.

5. The image sensor according to claim 1, wherein the spacers comprises a light shielding material selected from a group consisting of metal, metal oxide, metal nitride, alloys and arbitrary combinations thereof.

6. The image sensor according to claim 1, wherein the spacers comprise a metal material selected from a group consisting of copper (Cu), silver (Ag), aluminum (Al), titanium (Ti), tungsten (W), tantalum (Ta) and arbitrary combinations thereof.

7. The image sensor according to claim 1, wherein each of the photoelectric transducer devices comprises:
    a photo diode (PD) disposed in the semiconductor substrate;
    a floating drain region disposed in the semiconductor substrate and separated from the PD; and
    a gate structure disposed on the front side surface of the semiconductor substrate and adjacent to the PD and the floating drain region.

8. The image sensor according to claim 1, further comprising a metal interconnection structure disposed on the front side surface and electrically connected to the photoelectric transducer devices.

9. The image sensor according to claim 1, wherein the grid structure comprises:
    a frame portion consisting of a portion of the dielectric isolating structure that is exposed from the backside surface of the substrate; and
    of the recess being defined by the frame portion and the backside surface of the semiconductor substrate.

* * * * *